United States Patent [19]
Cueli

[11] Patent Number: 5,513,019
[45] Date of Patent: Apr. 30, 1996

[54] SEMI-TRANSPARENT REFLECTIVE LAYER FOR A PHASE HOLOGRAM

[75] Inventor: Peter Cueli, Belle Mead, N.J.

[73] Assignee: Crown Roll Leaf, Inc., Paterson, N.J.

[21] Appl. No.: 143,542

[22] Filed: Oct. 26, 1993

Related U.S. Application Data

[63] Continuation-in-part of Ser. No. 48,769, Apr. 16, 1993, Pat. No. 5,351,142.

[51] Int. Cl.⁶ .............................. B42D 15/00; G03H 1/00; G02B 5/32; G02B 5/28
[52] U.S. Cl. .................. 359/2; 283/86; 283/91; 283/94; 359/15; 359/584
[58] Field of Search .............................. 359/2, 3, 15, 584, 359/590; 283/85, 86, 904, 91, 94; 430/2, 1

[56] References Cited

U.S. PATENT DOCUMENTS

| | | |
|---|---|---|
| 3,552,853 | 1/1971 | Sanders et al. . |
| 3,578,845 | 5/1971 | Brooks et al. . |
| 3,580,657 | 5/1971 | Sheridon . |
| 3,703,407 | 11/1972 | Hannan et al. . |
| 3,790,245 | 2/1974 | Hannan et al. . |
| 3,858,977 | 1/1975 | Baird et al. . |
| 3,869,301 | 3/1975 | Decker et al. . |
| 3,887,742 | 6/1975 | Reinnagel . |
| 4,014,602 | 3/1977 | Ruell . |
| 4,034,211 | 7/1977 | Horst et al. . |
| 4,168,346 | 9/1979 | Pezzoli . |
| 4,269,473 | 5/1981 | Flothmann et al. . |
| 4,330,604 | 5/1982 | Wreede et al. . |
| 4,389,472 | 6/1983 | Neuhaus et al. . |
| 4,419,436 | 12/1983 | Kranser . |
| 4,501,439 | 2/1985 | Antes . |
| 4,563,024 | 1/1986 | Blyth . |
| 4,597,814 | 7/1986 | Colgate, Jr. . |
| 4,631,222 | 12/1986 | Sander . |
| 4,758,296 | 7/1988 | McGrew . |
| 4,839,250 | 6/1989 | Cowan . |
| 4,856,857 | 8/1989 | Takeuchi et al. . |
| 4,906,315 | 3/1990 | McGrew . |
| 4,921,319 | 5/1990 | Mallik . |
| 4,933,120 | 6/1990 | D'Amato et al. . |
| 4,978,804 | 12/1990 | Woell . |
| 5,044,707 | 9/1991 | Mallik . |
| 5,083,850 | 1/1992 | Mallik et al. . |
| 5,093,538 | 3/1992 | Woell . |
| 5,128,779 | 7/1992 | Mallik . |
| 5,145,212 | 9/1992 | Mallik . |
| 5,351,142 | 9/1994 | Cuen .......................... 359/2 |

FOREIGN PATENT DOCUMENTS

| | | |
|---|---|---|
| 3422908 | 1/1986 | Germany . |
| 631920 | 9/1982 | Switzerland . |
| 2181993 | 5/1987 | United Kingdom . |

*Primary Examiner*—Martin Lerner
*Attorney, Agent, or Firm*—Woodcock Washburn Kurtz Mackiewicz & Norris

[57] ABSTRACT

A phase hologram is embossed in a mylar web having a reflective layer which is made from tin tungsten oxide, zinc sulfide, or a mixture thereof. The embossed microtexture produces a hologram that is semi-transparent, thereby allowing the visualization of indicia underlying the hologram.

23 Claims, 1 Drawing Sheet

SEMI-TRANSPARENT REFLECTIVE LAYER FOR A PHASE HOLOGRAM

CROSS REFERENCE TO RELATED APPLICATION

This is a continuation-in-part of application Ser. No. 08/048,769 filed Apr. 16, 1993, now U.S. Pat. No. 5,351,142, issued Sept. 27, 1994.

FIELD OF THE INVENTION

The present invention relates to holograms and methods for making same, and, more particularly, to a reflective layer for a phase hologram.

BACKGROUND OF THE INVENTION

Holograms have recently come into wide usage as decorative indicia due to the hologram's unique capacity to reconstruct three-dimensional images from a seemingly two-dimensional surface. Holograms are thus readily identifiable as such, even upon casual inspection, since non-holographic indicia do not create a three-dimensional virtual image. Apparatus utilized to fabricate holograms are typically complex, expensive and require sophisticated personnel to operate. Accordingly, the production of holograms is a specialty which is engaged in by companies which are suitably equipped through substantial capital expenditures.

Since holograms are difficult to make and are readily identifiable as holograms, they have become commonly employed as a means for verifying or authenticating documents, such as credit cards, driver's licenses and access cards of many types. This presumes that forgers do not generally have a means for producing holograms. Typically, the hologram is integrated with a document, e.g., an identification card, in a manner which prevents the non-destructive separation of the hologram from the document. This makes it difficult for forgers, e.g., to dissect an existing identification card and remove the hologram for the purpose of applying it to a forged identification card.

Besides holograms, producers of credit cards and the like have other techniques which may be employed to ensure the authenticity of the credit cards which are presented to stores and other vendors of goods and services. For example, credit cards now routinely include a photograph of the individual to whom the card is issued, as well as the individual's handwritten signature, both of which are incorporated into the card in a manner which prevents non-destructive isolation or removal of that element and thereby frustrates the forger. In addition to holograms and other unique identifying indicia which are incorporated into credit cards and the like, such cards frequently contain additional information, for example the identity of the issuer of the card, the account number, issue date, and various other bits of information concerning the rightful bearer and the issuer of the card.

Since credit cards and the like are intended to fit conveniently into a wallet or pocket, they are compact, thereby restricting the quantity and dimensions of the various indicia that can be displayed thereon. Thus, credit cards and other identification cards typically have discrete areas on the surface thereof which are dedicated to particular uses, for example an area which would contain the photograph of the individual bearer, an area containing written information and text, and an area for the signature of the bearer. In addition, a discrete portion of the card is normally reserved for a hologram if one is incorporated into the card.

As noted above, it is a design objective for verification apparatus and techniques for verifying cards and other documents to render the card integrated in a fashion which prevents its dissection into parts and subsequent falsified reassembly by a forger. Known techniques for accomplishing this integration function include laminating the various components into a common plastic matrix and/or adhering the respective elements to one another in a manner which prevents their non-destructive disassembly or disassociation. To this end, it is often desirable to distribute holographic indicia over a substantial portion of the surface area of a verified access card, e.g., a credit card, such that the hologram is structurally and visually associated with the entire card, rather than being relegated to a particular discrete area of the card.

In order to utilize a distributed hologram over the surface of a substrate and, at the same time, avoid obscuring other indicia which appears thereon, it has been recognized that the hologram must be at least partially transparent. Typical mass-produced holograms are phase holograms embossed in optically clear thermoplastic film as a microtexture which is then overcoated with a reflective layer. To achieve semi-transparency, strategies have been devised relating to the reflective layer. For example, U.S. Pat. No. 4,921,319 to Mallik discloses an embossed phase hologram carrying a relief pattern on one surface, which has no reflective coating thereon. Instead, an air gap is maintained between the hologram and a supporting substrate to cause incident light to be reflected from the surface relief pattern. Since the refractive index of air is significantly different from that of the plastic substrate film in which the holographic pattern is embossed, there is reflection at the interface between the relieved surface and the air gap. The Mallik '319 patent suggests that the combination of the embossed film and the air gap sets up a degree of reflection which is sufficient to read the hologram but is at least partially transparent to permit the reading of indicia that is positioned behind the hologram.

U.S. Pat. No. 5,044,707 to Mallik discloses a phase hologram employing a plurality of discontinuous aluminum dots disposed on the embossed surface as the reflective layer. Because the aluminum dots are discontinuous, a viewer may view through the hologram, i.e., between the dots, to see indicia appearing below the discontinuous holographic pattern.

U.S. Pat. No. 3,578,845 to Brooks suggests that the reflective layers of a hologram may be rendered partially transparent by varying the thickness thereof namely, from 100 angstroms to 5 microns. Such a thin reflective layer achieves the desired transparency, as well as reflectivity.

The foregoing techniques and products do, however, suffer from certain drawbacks. For instance, the air-gap phase hologram concept requires an air pocket to be maintained in the card and does not provide adequate reflectivity to efficiently reconstruct the hologram. The concept of using spaced aluminum dots to form the reflective layer is disadvantageous because the dots obscure the underlying indicia, thereby rendering the hologram less transparent. In addition, the process for producing the spacing between the dots is inconvenient and expensive. Similarly, the concept of varying the thickness of the reflective layer, while producing a semi-transparent hologram, is likewise difficult to achieve using the traditional techniques for depositing metal coatings upon an embossed polymer substrate; and, like the provision of spaced aluminum dots, it achieves increased reflectivity only at the expense of obscuring the underlying indicia.

SUMMARY OF THE INVENTION

The problems and disadvantages associated with conventional holographic indicia and methods for forming same are overcome by the present invention which includes a phase hologram embossed in a substrate as a holographic microtexture occupying at least a portion of the surface of the substrate. A reflective layer is deposited upon the embossed microtexture of the substrate. Because the reflective layer has a refractive index different from that of the substrate, the reflective layer cooperates with the embossed microtexture of the substrate to create a holographic image. The reflective layer also has a transparency which permits the viewing of underlying indicia.

BRIEF DESCRIPTION OF THE FIGURES

For a better understanding of the present invention, reference is made to the following detailed description of an exemplary embodiment considered in conjunction with the accompanying drawings, in which.

DETAILED DESCRIPTION OF THE EXEMPLARY EMBODIMENT

Figure 1:
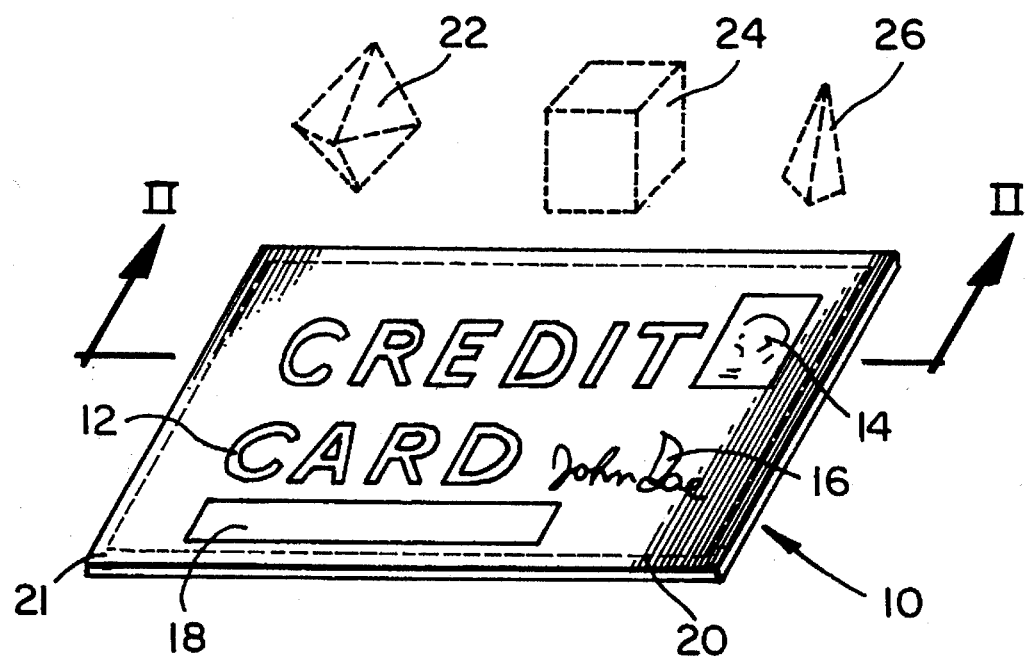
FIG. 1 is a perspective view of a holographically verified access card incorporating a hologram with a reflective layer constructed in accordance with an exemplary embodiment of the present invention.

FIG. 1 shows a credit card 10 bearing printed indicia 12 which is, for the purpose of illustration, simply "CREDIT CARD". Typically, indicia 12 would include the identification of the issuer, such as a bank, identification of the proper bearer, the issuer's ID number, the bearer's account number, etc. As an added indicator of reliability and to verity that the bearer is who he represents himself to be, a photograph 14 of the bearer is included on the credit card 10. In addition, the bearer's signature 16 is also emblazoned on the front of the credit card. Of course, the present invention is applicable for use on any type of document be it a credit card, an ID card, a driver's license or any other document, as shall be evident from the following description.

The credit card 10 depicted in FIG. 1 includes a magnetic strip 18 having magnetically encoded digital information concerning the bearer, his account and other information which is required to maintain a record of transactions, etc. In accordance with the present invention, a holographic overlay 20 (illustrated by the area outlined in dashed lines) covers substantially the entire surface area of the card 10. The holographic overlay 20 can have any dimensions and the composition or graphic content thereof is totally variable. In all probability, it is preferable in most applications that the holographic overlay 20 cover the entire surface area of the credit card 10, rather than leaving a border area 21, as shown, which is uncovered. The border area 21 was included for the purpose of illustration to show the demarcation of the holographic overlay 20.

The principal attribute of the holographic overlay 20 is that it is transparent to a degree which permits the underlying printed indicia 12, the photograph 14, and the signature 16 to be visible. In addition to permitting visualization of the underlying indicia, whether it be the printed indicia 12, the photograph 14 or the signature 16, the holographic overlay 20 permits the reconstruction of a three-dimensional virtual image stored in the holographic overlay 20 when viewed and illuminated at the correct angle. As noted, the content of the holographic image is totally variable.

The holographic overlay 20 depicted in FIG. 1 reconstructs three distinct three-dimensional figures symbolized by a tetrahedron 22, a cube 24 and a pyramid 26 shown in dotted lines and representing the virtual images which result from the reconstruction of the holographic image stored in the interference fringe pattern of the holographic overlay 20. The holographic overlay 20 could alternatively reconstruct a repeating pattern with little or no space between repeated image components, or a non-repeating pattern, e.g., a unitary image having discernable parts. By substantially covering the entirety of the credit card 10 with the holographic overlay 20, a forger is prevented from disassembling the card and extracting portions of the card, e.g., the photograph 14 and/or the signature 16, from the card 10 and incorporating it into a falsified card.

Figure 2:
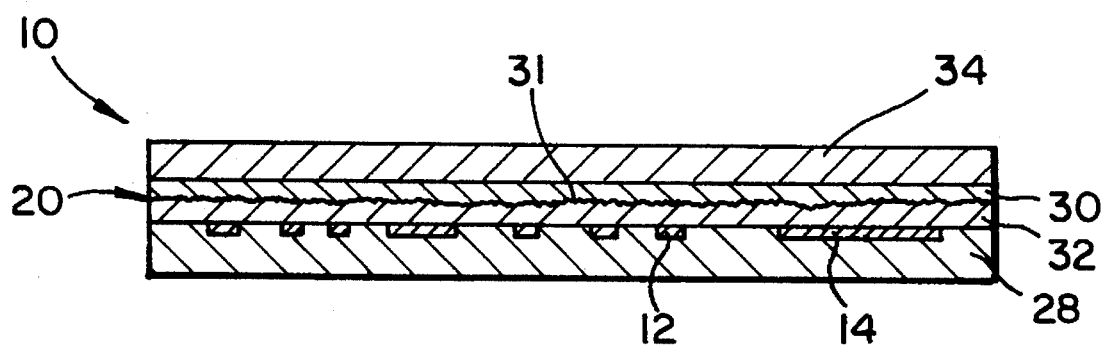
FIG. 2 is an enlarged cross-sectional view of the access card shown in FIG. 1 taken along section line II—II and looking in the direction of the arrows.

Having set forth certain of the functional attributes of a verified access or identification card constructed in accordance with the present invention, the detailed elements of the present invention along with methods for fabricating it shall now be discussed with particular reference to FIG. 2. Referring now to FIG. 2, the credit card 10 is shown with the photograph 14 and the printed indicia 12 formed within a polymer matrix 28. In general, the dimensions and relative orientations of the various components depicted in FIG. 2 are used for purposes of illustration and it should be appreciated that the thicknesses etc. depicted are not necessarily to scale. For example, the printed indicia 12 and the photograph 14 would be essentially flat, rather than having the substantial thickness depicted. It is reasonable to assume in accordance with common practices, that the polymer matrix 28 would typically be a thermoplastic into which the printed indicia 12 and/or the photograph 14 would be impressed or adhered in close association to prevent non-destructive disassembly by a forger. For this reason, the incorporation of the photograph 14 and the printed indicia 12 can be viewed as resulting in a substantially flat substrate as depicted.

The holographic overlay 20 is also adhered to the polymer matrix 28. This would typically be done by a suitable adhesive or by bonding fusible thermoplastics under the influence of heat and pressure. The holographic overlay 20 has at least two layers, an embossable layer 30 which is made from a thermoplastic, such as mylar, and which has an embossed microtexture 31.

It is known in the art that phase holograms can be formed by embossing holographic microtextures representing interference patterns attributable to holograms into an embossable thermoplastic. Further in accordance with known holographic techniques, the embossable layer 30 is coated on one side with a reflective layer 32. As noted above, the reflective layer 32 is typically formed from aluminum or silver or another substance having a refractive index differing from that of the embossable layer 30.

Whereas known techniques and materials have produced semi-transparent reflective layers which are not sufficiently transparent to permit adequate viewing of the underlying indicia while simultaneously allowing reconstruction of the holographic image, the present invention has such a reflective layer in the form of the reflective layer 32. More particularly, the reflective layer 32 is formed from tin tungsten oxide (SnWO4), zinc sulfide (ZnS), or a mixture of the two. When a mixture of tin tungsten oxide and zinc sulfide is used to form the reflective layer 32, the ratio can be about 80% to about 99% by weight of tin tungsten oxide and about 20% to about 1% by weight of zinc sulfide, it being understood that the percentages of the two components of the resulting mixture should total 100%. Thus, for example, a suitable and preferred ratio is 90% by weight of tin tungsten oxide and 10% by weight of zinc sulfide. All of these substances can be vapor deposited upon the embossable layer 30 in the following manner.

When the reflective layer 32 is formed from tin tungsten oxide, a web of embossable film, e.g., mylar, is advanced through a vacuum deposition chamber at a vacuum of approximately $10^{-5}$ Torr and at a feed rate in a range of from about 50 feet/minute to about 250 feet/minute. The tin tungsten oxide is evaporated onto the mylar film at a temperature of approximately 1000 degrees C., resulting in a layer of tin tungsten oxide having a thickness in a range of from about 5,000 angstroms to about 10,000 angstroms.

When the reflective layer 32 is formed from zinc sulfide, a web of embossable film, e.g., mylar, is advanced through a vacuum deposition chamber at a vacuum of approximately $10^{-5}$ Torr and at a feed rate in a range of from about 400 feet/minute to about 600 feet/minute. The zinc sulfide is evaporated onto the mylar film at a temperature of approximately 1000 degrees C., resulting in a layer of zinc sulfide having a thickness in a range of from about 5,000 angstroms to about 10,000 angstroms.

When the reflective layer 32 is formed from a mixture of tin tungsten oxide and zinc sulfide, a web of embossable film, e.g., mylar, is advanced through a vacuum deposition chamber at a vacuum of approximately $10^{-5}$ Torr and at a feed rate in a range of from about 400 feet/minute to about 600 feet/minute. The zinc sulfide is evaporated onto the mylar film at a temperature of approximately 1000 degrees C., resulting in a layer of the mixture having a thickness in a range of from about 3,000 angstroms to about 10,000 angstroms.

Tin tungsten oxide, zinc sulfide, and mixtures thereof are non-toxic substances which are readily available and inexpensive. In addition to these beneficial attributes, tin tungsten oxide, zinc sulfide, and mixtures thereof, when utilized as a reflective layer on a phase hologram, produce a reflective layer which is semi-transparent to permit visualization of underlying indicia while retaining efficiency in reconstructing the virtual image of the hologram. As a reflective layer in a phase hologram, tin tungsten oxide, zinc sulfide, and mixtures thereof are not as sensitive to deposition thickness as, e.g., aluminum, permitting vapor deposition to be conducted without a degree of monitoring and control which would otherwise complicate the production of the phase holograms. For this reason, phase holograms constructed in accordance with the present invention may be mass produced rapidly and without extensive processing, environmental and/or health and safety concerns.

Still referring to FIG. 2, a transparent cover sheet 34 is applied over the holographic overlay 20 to protect the hologram and to stiffen the card 10. The cover sheet 34 would be strongly adhered to the holographic overlay 20 by a suitable adhesive, or through the lamination of a thermoplastic polymer under heat and pressure. Thus, the present invention provides a mass producible, semi-transparent hologram which is suitable for covering credit cards, access cards and other documents requiring verification through the incorporation of holograms. The hologram is simultaneously transparent enough to view the underlying indicia while retaining efficiency in reconstructing the virtual image associated with the hologram.

It should be understood that the embodiment described herein is merely exemplary and that a person skilled in the art may make many variations and modifications without departing from the spirit and scope of the invention. All such variations and modifications are intended to be included within the scope of the invention as defined in the appended claims.

I claim:

1. A phase hologram, comprising:
   (a) a substrate having a holographic microtexture embossed therein on at least a portion of a surface thereof; and
   (b) a reflective layer of a mixture of tin tungsten oxide and zinc sulfide deposited upon said embossed microtexture said reflective layer having a refractive index different from that of said substrate and being at least semi-transparent.

2. The hologram of claim 1, wherein said mixture has a ratio of about 80% to about 99% by weight of tin tungsten oxide and about 20% to about 1% by weight of zinc sulfide.

3. The hologram of claim 2, wherein said substrate is an optically clear thermoplastic film.

4. The hologram or claim 3, wherein said film is mylar and said mixture has a thickness in a range of from about 5,000 angstroms to about 7,000 angstroms.

5. The hologram of claim 2, wherein said ratio is 90% by weight of tin tungsten oxide and 10% by weight of zinc sulfide.

6. A method for producing holograms, comprising the steps of:
   (a) embossing a substrate with a holographic microtexture on at least a portion of a surface thereof; and
   (b) depositing a reflective layer of a mixture of tin tungsten oxide and zinc sulphide upon said embossed microtexture, said reflective layer having a refractive index different from that of said substrate and being at least semi-transparent.

7. The method of claim 6, wherein said mixture has a ratio of about 80% to about 99% by weight of tin tungsten oxide and about 20% to about 1% by weight of zinc sulfide.

8. The method of claim 7, wherein said depositing step is performed by vapor deposition.

9. The method of claim 8, wherein said embossing step is performed upon a thermoplastic film.

10. The method of claim 9, wherein said ratio is 90% by weight of tin tungsten oxide and 10% by weight of zinc sulfide.

11. The method of claim 9, wherein said thermoplastic film is mylar.

12. The method of claim 11, wherein said thermoplastic film is in web form.

13. The method of claim 12, wherein said mixture is deposited to a thickness in a range of from about 5,000 angstroms to about 7,000 angstroms.

14. The method of claim 13, wherein said mixture is deposited upon said film by advancing said web through a vacuum deposition chamber at a feed rate in a range of from about 400 feet/minute to about 600 feet/minute.

15. The method of claim 14, wherein said vacuum deposition chamber is operated at a vacuum of approximately $10^{-5}$ Torr.

16. An authenticated document, comprising:
   (a) a substrate bearing encoded data; and
   (b) a holographic overlay affixed to said substrate overlying at least a portion of said encoded data to prevent non-destructive separation of said overlay from said substrate, said overlay being at least semi-transparent to permit visualization of said encoded data through said overlay and comprising a reflective layer comprising tin tungsten oxide and zinc sulfide.

17. The document of claim 16, wherein said holographic overlay is a phase hologram having a semi-transparent reflective layer.

18. The document of claim 16, wherein said data includes data encoded in printed text.

19. The document of claim 18, wherein said data includes a photograph.

20. The document of claim 19, wherein said data includes a handwritten signature.

21. The document of claim 20, wherein said reflective layer is made from tin tungsten oxide.

22. The document of claim 17, wherein said mixture has a ratio of about 80% to about 99% by weight of tin tungsten oxide and about 20% to about 1% by weight of zinc sulfide.

23. The document of claim 22, wherein said ratio is 90% by weight of tin tungsten oxide and 10% by weight of zinc sulfide.

* * * * *